US010224581B2

(12) United States Patent
Ogg

(10) Patent No.: US 10,224,581 B2
(45) Date of Patent: *Mar. 5, 2019

(54) BATTERY MANAGEMENT

(71) Applicant: Servato Corp., New Orleans, LA (US)

(72) Inventor: Randy Ogg, Newberry, FL (US)

(73) Assignee: Servato Corp., New Orleans, LA (US)

( * ) Notice: Subject to any disclaimer, the term of this patent is extended or adjusted under 35 U.S.C. 154(b) by 158 days.

This patent is subject to a terminal disclaimer.

(21) Appl. No.: 15/352,098

(22) Filed: Nov. 15, 2016

(65) Prior Publication Data

US 2017/0117591 A1    Apr. 27, 2017

Related U.S. Application Data

(63) Continuation of application No. 13/591,813, filed on Aug. 22, 2012, now Pat. No. 9,531,037.

(Continued)

(51) Int. Cl.
*H02J 7/00* (2006.01)
*H01M 10/42* (2006.01)
(Continued)

(52) U.S. Cl.
CPC ...... H01M 10/4257 (2013.01); G01R 31/362 (2013.01); G01R 31/3658 (2013.01);
(Continued)

(58) Field of Classification Search
CPC ......... H01M 10/4257; H01M 10/4207; H01M 10/441; G01R 31/362; G01R 31/3658; H02J 7/0021
(Continued)

(56) References Cited

U.S. PATENT DOCUMENTS 5,886,503 A    3/1999   McAndrews et al.
7,615,964 B2  11/2009   Fukuda
(Continued)

FOREIGN PATENT DOCUMENTS

JP       10270092 A    10/1998

OTHER PUBLICATIONS

Dynamis Batterien; "Sealed Lead Acid Batteries Technical Manual;" Dec. 4, 2006: pp. 1-15; 15 pages.
(Continued)

*Primary Examiner* — Zixuan Zhou
(74) *Attorney, Agent, or Firm* — Daly, Crowley, Mofford & Durkee, LLP

(57) ABSTRACT

Battery management may be provided. First, a battery string in a battery bank may be charged for a charge time. After charging the battery string, the battery string may be isolated from charging for a rest time. Once the charging and resting from charging is complete, a test open circuit voltage for each battery in the first battery string may be measured. In addition, a defective indicator that a battery is defective may be recorded in a database. Next, a battery may be loaded with a preset load for a load time. After loading the battery, a test load voltage for each of the batteries loaded with the preset load may be measured. A second defective indicator that a battery is defective may be recorded in the database when the test load voltage for the second battery is greater than a load voltage differential.

20 Claims, 10 Drawing Sheets

Related U.S. Application Data

(60) Provisional application No. 61/526,430, filed on Aug. 23, 2011.

(51) Int. Cl.
*G01R 31/36* (2019.01)
*H01M 10/44* (2006.01)
*H01M 10/48* (2006.01)

(52) U.S. Cl.
CPC ..... *H01M 10/4207* (2013.01); *H01M 10/441* (2013.01); *H01M 10/482* (2013.01); *H02J 7/0021* (2013.01); *H01M 2010/4271* (2013.01); *H01M 2010/4278* (2013.01); *H01M 2220/10* (2013.01)

(58) Field of Classification Search
USPC .......................................... 320/121, 116–119
See application file for complete search history.

(56) References Cited

U.S. PATENT DOCUMENTS

| | | |
|---|---|---|
| 7,728,552 B2 | 6/2010 | Burns |
| 8,279,074 B2 | 10/2012 | Fischer |
| 8,310,103 B2 | 11/2012 | Fischer |
| 8,497,600 B2 | 7/2013 | Fischer |
| 8,729,732 B2 | 5/2014 | Fischer |
| 2001/0048286 A1 | 12/2001 | Tanaka et al. |
| 2002/0017895 A1 | 2/2002 | Kawashima |
| 2004/0155629 A1 | 8/2004 | Kobayashi et al. |
| 2005/0151657 A1* | 7/2005 | Lockhart .......... G01R 19/16542 340/636.1 |
| 2007/0024246 A1 | 2/2007 | Flaugher |
| 2007/0046261 A1* | 3/2007 | Porebski ............ G01R 31/3641 320/132 |
| 2008/0007223 A1 | 1/2008 | Morioka |
| 2011/0227414 A1 | 9/2011 | Fischer |
| 2011/0260687 A1* | 10/2011 | Kudo .................. H01M 10/425 320/118 |
| 2013/0049762 A1 | 2/2013 | Ogg |

OTHER PUBLICATIONS

Moo, et al.; "State-of-Charge Estimation with Open-Circuit-Voltage for Lead-Acid Batteries;" 2007 Power Conversion Conference; Apr. 1, 2007; pp. 758-762; 5 pages.

European Extended Search Report for EP Appl. No. 12825777.1 dated Mar. 27, 2015; 9 pages.

Response to European Extended Search Report for EP Appl. No. 12825777.1 dated Mar. 27, 2015; as filed on Oct. 26, 2015; 18 pages.

International Search Report and Written Opinion dated Oct. 22, 2012 issued in corresponding PCT/US2012/052064; 9 pages.

U.S. Appl. No. 13/591,813, filed Aug. 22, 2012; 388 pages.

* cited by examiner

BATTERY MANAGEMENT

CROSS REFERENCE TO RELATED APPLICATIONS

This application is a continuation of U.S. patent application Ser. No. 13/591,813 entitled "BATTERY MANAGEMENT," filed Aug. 22, 2012 which claims the benefit of U.S. Provisional Application No. 61/526,430 filed Aug. 23, 2011 both of which are incorporated by reference herein in their entireties.

BACKGROUND

Float charging is charging a battery at a similar rate as its self-discharging rate, thus maintaining a full capacity battery. Most rechargeable batteries have a moderate rate of self-discharge, meaning they gradually lose their charge even if they are not used in a device. Care must be taken so that the charge rate is not greater than the level of self-discharge, or overcharging and possible damage or leakage may occur.

SUMMARY

A method for battery management is disclosed. The method may comprise charging a battery string in a battery bank for a charge time. After charging, the battery string may be isolated from charging for a rest time. Once the charging and resting from charging is complete, a test open circuit voltage for each battery in the first battery string may be measured. In addition, a defective indicator may be recorded in a database when the test open circuit voltage for the first battery is below a predetermined voltage level. Also, a battery may be loaded with a preset load for a load time. After loading the battery, a test load voltage for each of the batteries loaded with the preset load may be measured. A second defective indicator that a battery is defective may be recorded in the database when the test load voltage for the second battery is greater than a load voltage differential.

Both the foregoing general description and the following detailed description are examples and explanatory only, and should not be considered to restrict the invention's scope, as described and claimed. Further, features and/or variations may be provided in addition to those set forth herein. For example, embodiments of the Invention may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present invention. In the drawings.

DETAILED DESCRIPTION

Figure 1:
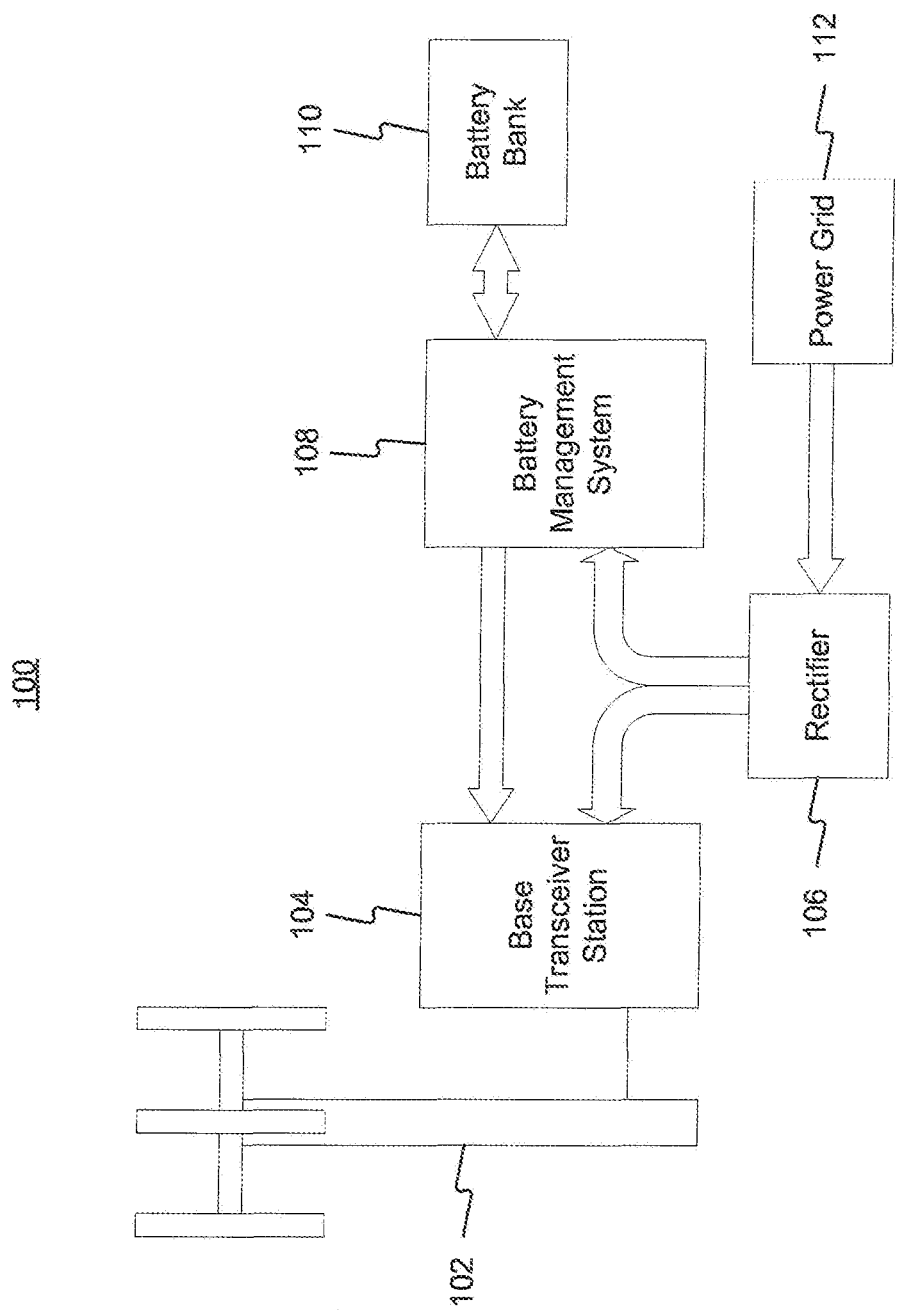
FIG. 1 is a block diagram of an operating environment for a battery management system.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

Consistent with embodiments of the present invention, a battery management system may be provided. The battery management system may isolate, charge, and test individual batteries within a battery bank. The isolating, charging, and testing may be performed without having to remove batteries or otherwise take them out of service. The battery management system may also detect a failed battery and may prevent it from charging, thus protecting the remaining batteries and avoiding wasting energy.

Consistent with embodiments of the present invention, the battery management system may keep batteries continually connected to a bus to supply power during a power outage. Diodes may allow the batteries in the battery bank to discharge at anytime (e.g., during a power outage). A switch may be used to bypass the diodes whenever the batteries in the battery bank may need to charge. Moreover, the battery management system may utilize removable battery connection modules. The connection modules may provide for connection of multiple battery banks having multiple batteries.

FIG. 1 is a block diagram of an operating environment 100 consistent with embodiments of the invention. Operating environment 100 may include a cell tower 102, a base transceiver station 104, a rectifier 106, a battery management system 108, a battery bank 110, and a power grid 112. Cell tower 102 may be connected to base transceiver station 104 such that cell tower 102 may facilitate cellular telephone communications. Since base transceiver stations may operate on DC (direct current), base transceiver station 104 may be connected to rectifier 106. Rectifier 106 may covert AC (alternative current) power from power grid 112 to DC power. Battery management system 108 may operate on DC power in order to charge battery bank 110. Thus, battery management system 108 may also be connected to rectifier 106 to receive power. Operating environment 100 may include supplying power to any type of device and is not limited to supplying power to a cell tower or a base transceiver station.

As shown in FIG. 1, battery management system 108 may be located between battery bank 110 and base transceiver station 104. Having battery management system 108 between battery bank 110 and base transceiver station 104 may allow battery management system 108 to isolate the batteries in battery bank 110 from base transceiver station 104, rectifier 106, and power grid 112.

Isolating battery bank 110 from rectifier 106 and power grid 112 may keep battery bank 110 from undergoing a float charge (i.e., continuous charging). Isolating battery bank 110 and controlling its charge cycle using battery management system 108 may also protect battery bank 110 from power surges, overheating, and other dangerous situations.

Figure 2:
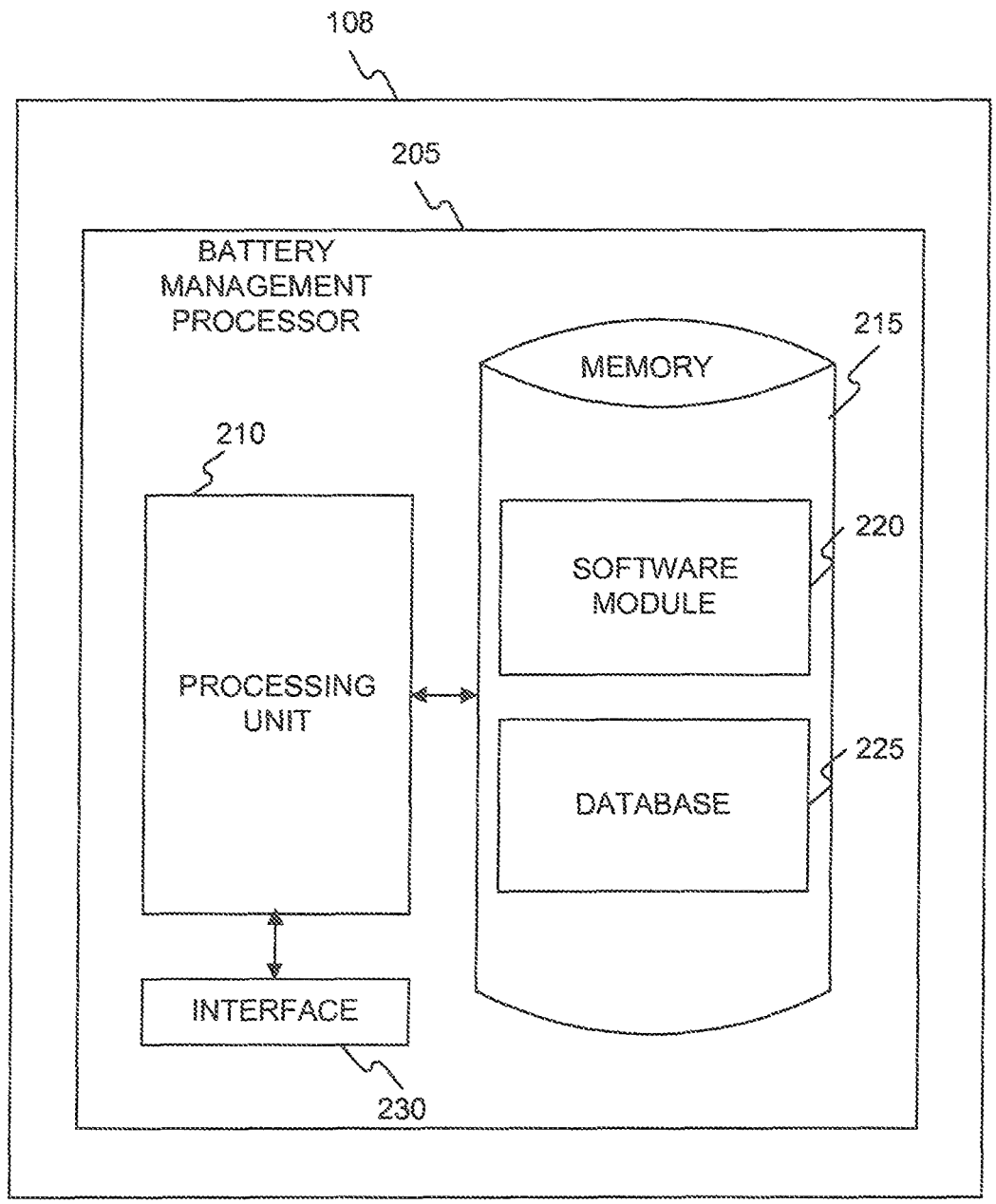
FIG. 2 is a block diagram of a battery management processor.

FIG. 2 shows a battery management processor 205 that may be included in battery management system 108. As shown in FIG. 2, battery management processor 205 may include a processing unit 210, a memory 215, and an Interface 230. Memory 215 may include a software module 220 and a database 225. Interface 230 may allow battery management processor 205 to connect with other elements of battery management system 108, including additional battery management processors. While executing on processing unit 210, software module 220 may perform processes for providing battery management comprising one or more of the stages included in method 400 described below with respect to FIG. 4. Furthermore, while shown in battery management system 108, software module 220, processing unit 210, database 225, and interface 230 may be executed on or reside in any element shown in FIGS. 1 and 3.

Battery management processor 205 ("the processor") may be implemented using a programmable logic controller (PLC), a personal computer, a network computer, a mainframe, or other similar microcomputer-based workstation. The processor may comprise any computer operating environment, such as hand-held devices, multiprocessor systems, microprocessor-based or programmable sender electronic devices, minicomputers, mainframe computers, and the like. The processor may also be practiced in distributed computing environments where tasks are performed by remote processing devices. Furthermore, the processor may comprise a mobile terminal, such as a smart phone, a cellular telephone, a cellular telephone utilizing wireless application protocol (WAP), personal digital assistant (PDA), intelligent pager, portable computer, a hand held computer, a conventional telephone, a wireless fidelity (Wi-Fi) access point, or a facsimile machine. The aforementioned systems and devices are examples and the processor may comprise other systems or devices.

While FIG. 2 shows database 225 being local to battery management processor 205, embodiments of the invention may comprise database 225 being in a different location than battery management processor 205. For example, battery management processor 205 may be located onsite with cell tower 102 and base transceiver station 104 and database 225 may be located offsite. In addition, embodiments may comprise database 225 being accessible via a user interface. The user interface may include, for example, a web interface, a command line interface, web services interface, and other management protocols. The web interface may allow a user to provide continuous monitoring, view diagnostic information, receive error messages, and alter a method for battery management.

Figure 3A:
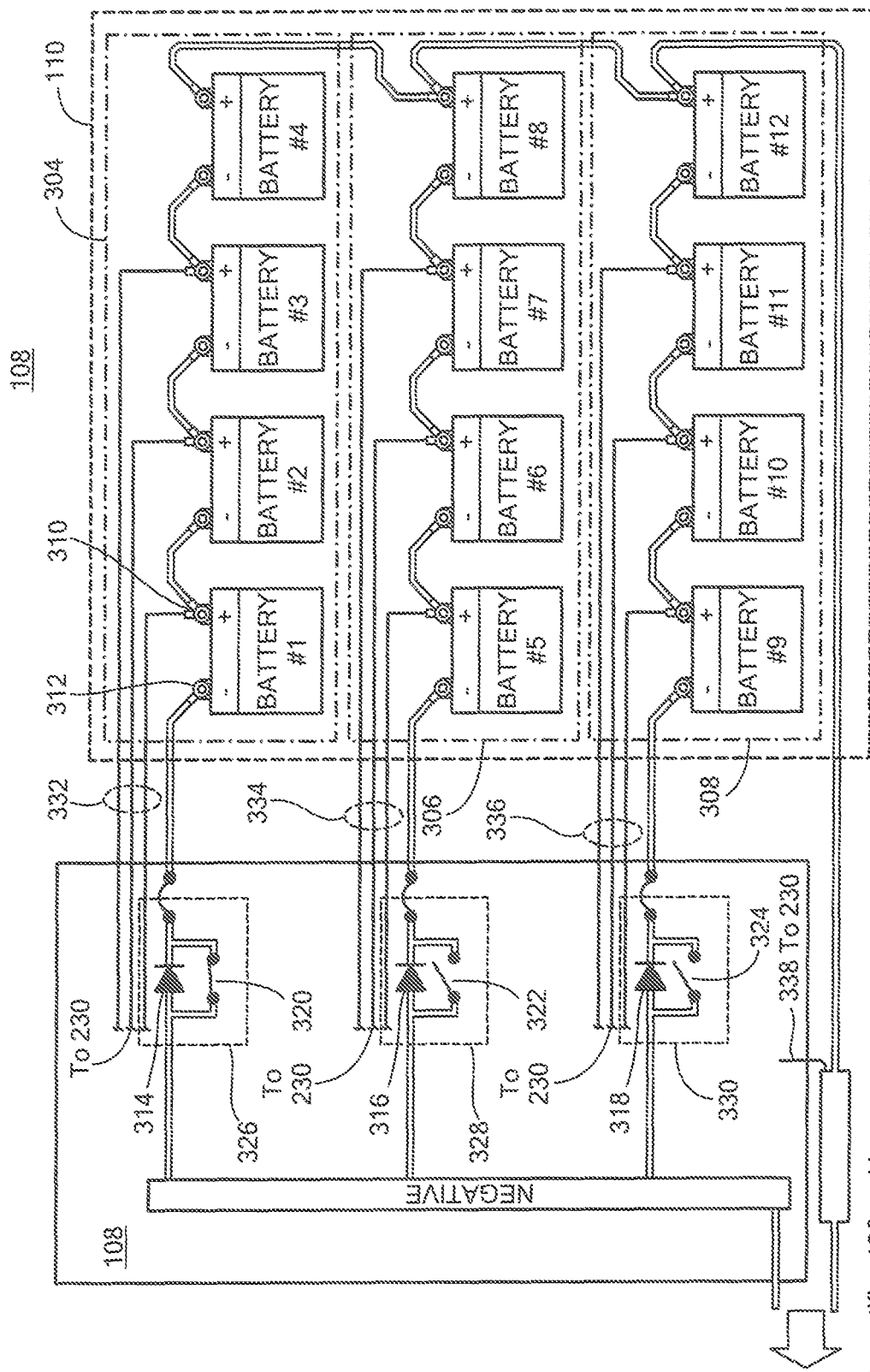
FIG. 3A shows a battery management system and a battery bank with the battery strings connected in parallel in more detail.

FIG. 3A shows battery management system 108 and an embodiment of battery bank 110 in more detail. As shown in FIG. 3A, battery management system 108 may be connected to battery bank 110. Battery bank 110 may have a first battery string 304, a second battery string 306, and a third battery string 308. Each battery string may include a plurality of batteries. For example, first battery string 304 may include battery 1, battery 2, battery 3, and battery 4. Second battery string 306 may include battery 5, battery 6, battery 7, and battery 8. Third battery string 308 may include battery 9, battery 10, battery 11, and battery 12. Each battery may have a positive lead 310 and a negative lead 312. As will be described in greater detail below, positive lead 310 and negative lead 312 may be connected to battery management processor 205 (e.g., through interface 230) and used to take voltage readings, apply a test load, and charge the battery strings. While FIG. 3A shows three battery strings having four batteries each, embodiments of the invention may include any number of battery strings having any number of batteries.

First battery string 304, second battery string 306, and third battery string 308 are kept from discharging to base transceiver station 104 by a first switching device 326 (e.g., comprising a first diode 314 and a first switch 320), by a second switching device 328 (e.g. comprising a second diode 316 and a second switch 322), and by a third switching device 330 (e.g. comprising a third diode 318 and a third switch 324). During normal operations, base transceiver station 104 may be powered with DC from rectifier 106 and first switch 320, second switch 322, and third switch 324 may be open. When modified (e.g., closed) by processing unit 210, first switch 320, second switch 322, or third switch 324 may allow power to flow from rectifier 106 to charge respective battery strings in battery bank 110 from the bus as described below with respect to method 400. However, should power from rectifier 106 fail (e.g. power loss from power grid 112), first diode 314, second diode 316, and third diode 318 may provide electrical paths for battery bank 110 to discharge to the bus and provide power to base transceiver station 104.

Operating environment 100 may also include first battery string leads 332, second battery string leads 334, third battery string leads 336, and a positive bus lead 338. The aforementioned leads may be connected to interface 230 so that battery management processor 205 may take voltage measurements of the batteries or battery strings in battery bank 110 or to connect test loads to the batteries or battery strings in battery bank 110 as will be discussed below with respect to method 400.

Figure 3B:
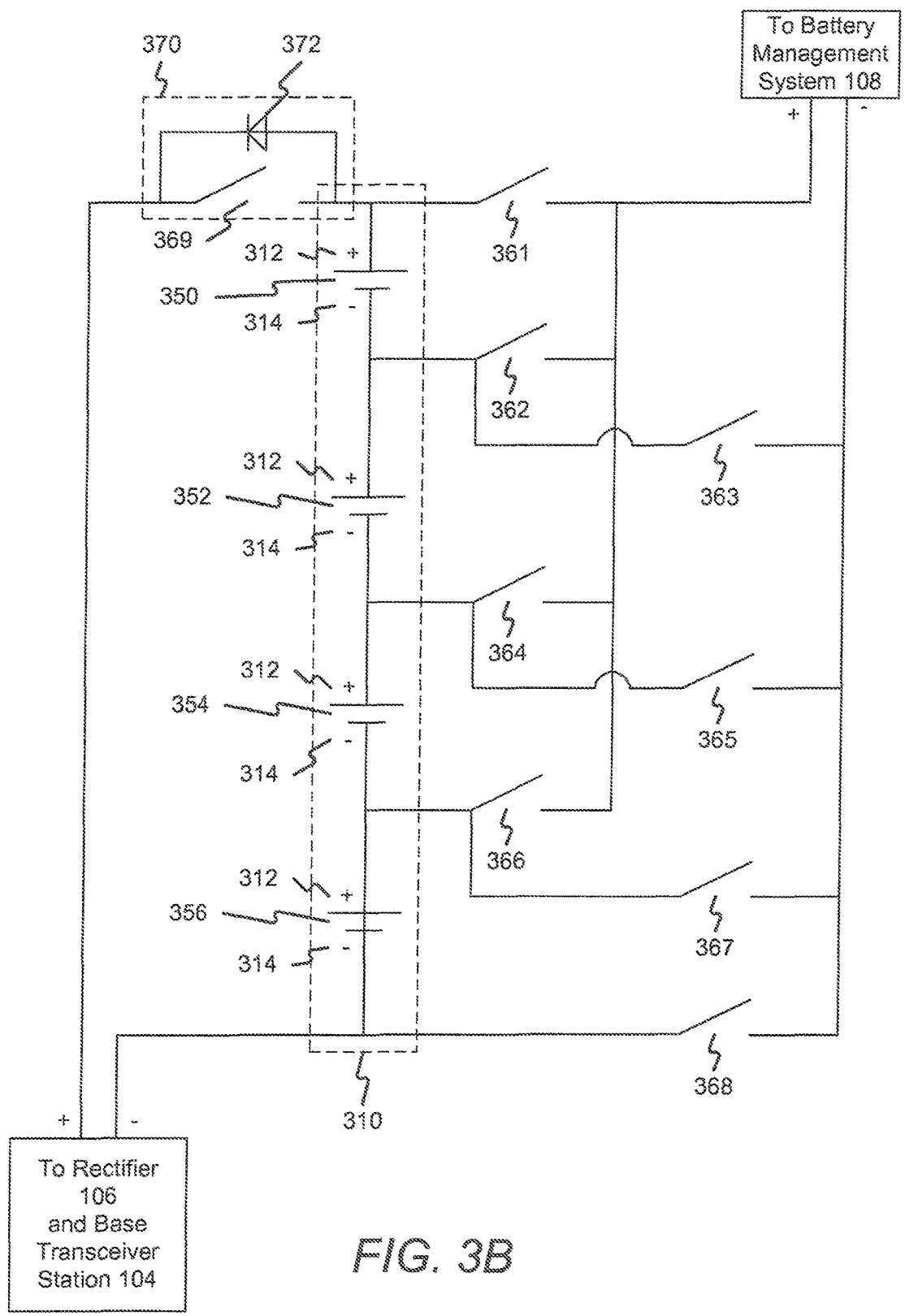
FIG. 3B shows a battery management system and a battery bank with batteries connected in series in more detail.

FIG. 3B shows battery management system 108 and an embodiment of battery bank 110 in more detail. As shown in FIG. 3B, battery management system 108 may be connected to battery bank 310. Battery bank 310 may have a first battery 350, a second battery 352, a third battery 354, and a fourth battery 356 connected in series. Each battery may have a positive lead 310 and a negative lead 312 of each battery. As will be described in greater detail below, positive lead 312 and negative lead 314 may be connected to battery management processor 205 (e.g., through interface 230) and used to take voltage readings, apply a test load, and charge the batteries. While FIG. 3B shows four batteries connected in series, embodiments of the invention may include any number of batteries connected in series.

A first switch 361, a second switch 382, and a third switch 363 may be located between positive lead 312 and negative lead 314 of first battery 350 and may be used to connect and disconnect first battery 350 to battery management processor 205. Second switch 362, third switch 363, a fourth switch 364, and a fifth switch 365 may be located between positive lead 312 and negative lead 314 of second battery 352 and may be used to connect and disconnect second battery 352 to battery management processor 205. Fourth switch 364, fifth switch 365, a sixth switch 366, and a seventh switch 367 may be located between positive lead 312 and negative lead 314 of third battery 354 and may be used to connect and disconnect third battery 354 to battery management processor 205. Sixth switch 366, seventh switch 367, and an eighth switch 368 may be located between positive lead 312 and negative lead 314 of fourth battery 356 and may be used to connect and disconnect fourth battery 356 to battery management processor 205.

During operation, battery management processor 205 may close first switch 361 and third switch 363 to connect first battery 350 to battery management processor 205 for testing and charging first battery 350. While first battery 350 is connect to battery management processor 205, second switch 362, fourth switch 364, fifth switch 365, sixth switch 366, seventh switch 367, and eighth switch 368 may be open to disconnect second battery 352, third battery 354, and fourth battery 356 from battery management processor 205.

To connect second battery 352 to battery management processor 205 for testing and charging, battery management processor 205 may close second switch 362 and fifth switch 365. While second battery 352 is connect to battery management processor 205, first switch 361, third switch 363, fourth switch 364, sixth switch 366, seventh switch 367, and eighth switch 368 may be open to disconnect first battery 350, third battery 354, and fourth battery 356 from battery management processor 205.

To connect third battery 354 to battery management processor 205 for testing and charging, battery management processor 205 may close fourth switch 364 and seventh switch 367. While third battery 354 is connect to battery management processor 205, first switch 361, second switch 362, third switch 363, fifth switch 355, sixth switch 366, and eighth switch 368 may be open to disconnect first battery 350, second battery 352, and fourth battery 356 from battery management processor 205.

To connect fourth battery 356 to battery management processor 205 for testing and charging, battery management processor 205 may close sixth switch 366 and eighth switch 368. While fourth battery 356 is connect to battery management processor 205, first switch 361, second switch 362, third switch 363, fourth switch 364, fifth switch 365, and seventh switch 367 may be open to disconnect first battery 350, second battery 352, and third battery 354 from battery management processor 205.

Battery bank 310 may be kept from discharging to base transceiver station 104 by a switching device 370 (e.g., comprising a first diode 372 and a ninth switch 369). During normal operations, base transceiver station 104 may be powered with DC from rectifier 106 and ninth switch 369 may be open. When closed by battery management processor 205, ninth switch 369 may allow power to flow from rectifier 106 to charge respective batteries in battery bank 310 from the bus as described below with respect to method 400. However, should power from rectifier 106 fail (e.g., power loss from power grid 112), diode 372 may provide an electrical path for battery bank 310 to discharge to the bus and provide power to base transceiver station 104.

While FIGS. 3A and 3B show switch/diode configuration embodiments of the invention may utilize other methods to isolate the batteries from float charging while maintaining the ability to discharge and power base transceiver station 104 in the event of a power failure at grid 112. For example, embodiments of the invention may utilize voltage control methods to isolate Battery bank 310 from float charging while maintaining the ability to discharge and power base transceiver station 104 in the event of a power failure at grid 112. For instance, embodiments of the invention may include adjusting rectifier 106's voltage up and down to control Battery bank 310's charge and discharge cycle, use a resistor set in series to adjust voltage up and down to control Battery bank 310's charge and discharge, use a charger circuit (e.g., an amplifier to raise voltage to charge Battery bank 310), and use an independent charger system to charge the batteries. Another example of voltage control may include, running a series voltage using base transceiver station 104 as a resistor to drop voltage and run a parallel voltage to charge the battery bank 310.

Figure 4:
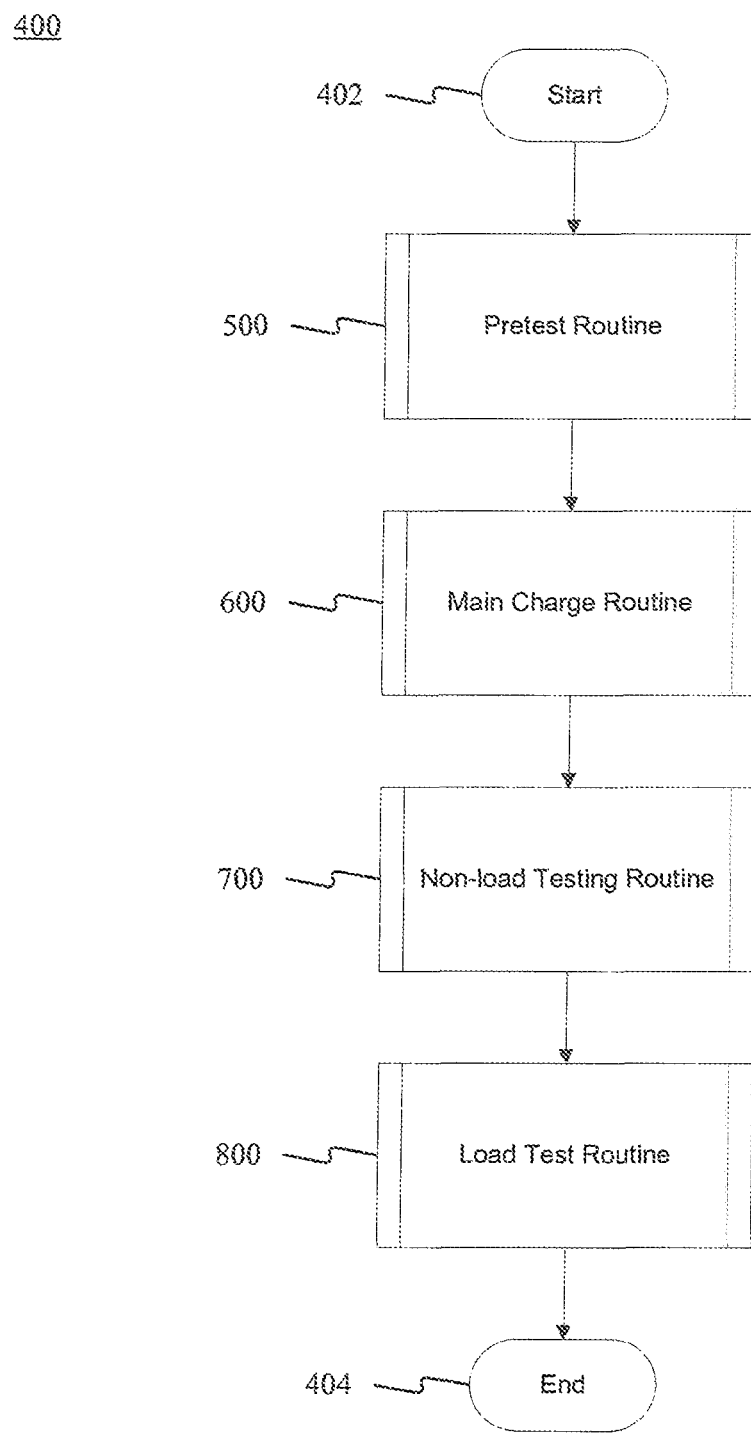
FIG. 4 is a flow chart for a battery management routine.

FIG. 4 is a flow chart setting forth the general stages involved in a method 400 consistent with an embodiment of the invention for providing battery management. Method 400 may be implemented using, for example, battery management processor 205 as described in more detail above with respect to FIG. 2. Ways to implement the stages of method 400 will be described in greater detail below.

Method 400 may begin at starting block 402 and battery management processor 205 may proceed to subroutine 500 where battery management processor 205 may execute a pretest routine. Subroutine 500 will be described in greater detail below with respect to FIG. 5. After executing the pretest routine, battery management processor 205 may proceed to subroutine 600 and execute a main charge routine 600. Subroutine 600 will be described in greater detail below with respect to FIG. 6. After executing main the charge routine, battery management processor 205 may proceed to subroutine 700 and perform a non-load testing routine. Subroutine 700 will be described in greater detail below with respect to FIG. 7. Once the non-load testing routine is complete, battery management processor 205 may proceed to subroutine 800 and execute a load test routine. Subroutine 800 will be described in greater detail below with respect to FIG. 8. After executing the load test routine, battery management processor 205 may proceed to stage 404 where method 400 may end.

Method 400 may be performed at regularly schedule intervals. For example, every night at midnight battery management processor 205 may execute method 400. Also, should there be a power outage while battery management processor 205 is executing method 400, battery management processor 205 may immediately terminate method 400 and allow battery bank 110 or battery bank 310 to provide power to base transceiver station 104. Furthermore, after power is restored, battery management processor 205 may begin executing method 400 immediately or wait until the next scheduled time. For instance, if there is a power outage of power grid 112 at noon that last a short time (e.g., less than 5 minutes) battery management processor 205 may wait until midnight to execute method 400. Should the power outage be greater than a maximum outage time (e.g., greater than 5 minutes) battery management processor 205 may begin executing method 400 immediately upon power from rectifier 106 being restored. In addition, if the power outage is so great that first battery string 304, second battery string 306, and third battery string 308 or battery bank 310 are depleated beyond a certain level (e.g., 50% of full charge) then first battery string 304, second battery string 306, and third battery string 308 or battery bank 310 may all be placed on a float charge until each battery string reaches a minimum charge (e.g., 80% of full charge). After reaching the minimum charge level, battery management processor 205 may begin executing method 400.

Figure 5:
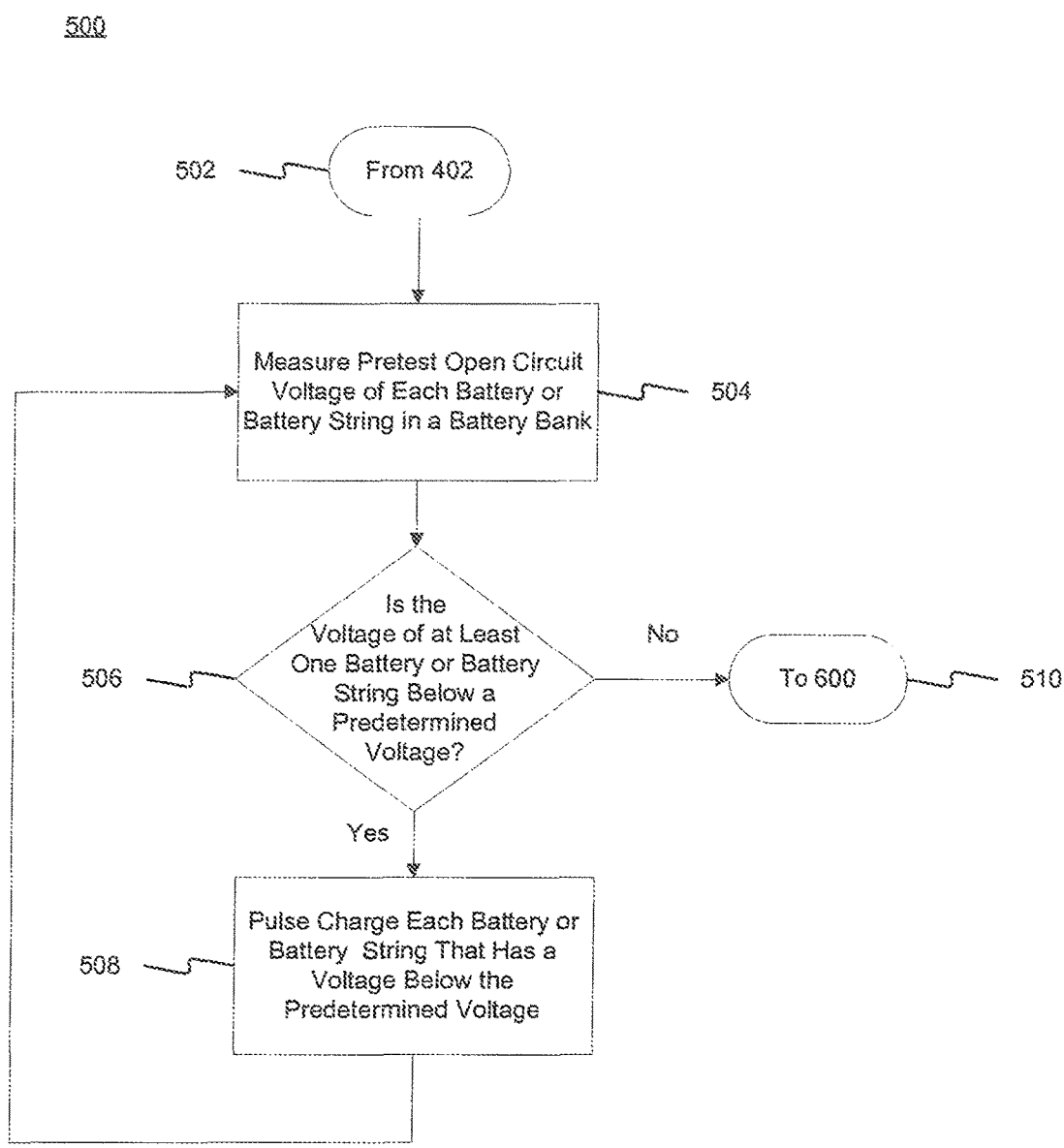
FIG. 5 is a flow chart for a pretest routine.

FIG. 5 shows subroutine 500. At stage 504, battery management processor 205 may measure a pretest open circuit voltage of the batteries in battery bank 110. For example, at stage 504, battery management processor 205 may measure the voltage of each battery in battery bank 110 or battery bank 310 individually. Or, consistent with other embodiments of the invention, battery management processor 205 may measure the voltage of each battery string (e.g. first battery string 304, second battery string 306, and third battery string 308).

After measuring the pretest open circuit voltage in stage 504, battery management processor 205 may proceed to decision block 506 where a determination may be made. At decision block 506 battery management processor 205 may determine if the pretest open circuit voltage (of any battery or battery string) is below a predetermined voltage. For example, when battery management processor 205 measures the pretest open circuit voltage of each battery in battery bank 110 or battery bank 310 individually, battery management processor 205 may compare the measurements to see if the pretest open circuit voltage is below 12.6 volts. 12.6 volts is an example, and other predetermined values may be used. In other embodiments, when battery management processor 205 measures the pretest open circuit voltage of an entire battery string (e.g., first battery sting 304), battery management processor 205 may compare the measurements to see if the pretest open circuit voltage is below 50.4 volts. 50.4 volts is an example, and other predetermined values may be used. The aforementioned predetermined voltages can be dependent on various parameters such as the battery, the battery's age, the number of times the battery has been discharged, the length of time since the battery was last charged.

If battery management processor 205 determines at decision block 506 that any of the batteries have a pretest open circuit voltage that is below the predetermined voltage, battery management processor 205 may proceed to stage 508 and pulse charge the batteries that have a pretest open circuit voltage that is below the predetermined voltage. Pulse charging the batteries may include connecting the battery to rectifier 106 for a certain time to allow the batteries to charge. For example, if battery 2 has a pretest open circuit voltage that is below the predetermined voltage, either battery 2 alone, or first battery string 304, may be connected to rectifier 106 to charge by battery management processor 205 closing first switch 320 in first switching device 326. The amount of time either battery 2, or first battery string 304, are connected to the bus, a pulse charging time, for charging may be a predetermined time. In addition, the pulse charging time may be constant (e.g., always a fixed time such as 50 milliseconds) or it may vary depending on a number of parameters. For instance, the pulse charging time my increase or decrease depending on how much below the pretest open circuit voltage is below the predetermined voltage.

After the batteries have been pulse charged at stage 508, battery management processor 205 may proceed to stage 504 where battery management processor 205 may measure the pretest open circuit voltages of other batteries or battery strings in battery bank 110 or battery bank 310. The cycle of battery management processor 205 executing stages 504, 506, and 508 may be performed a preset number of times (e.g., 5, 10, etc.), for a specific length of time (e.g., 5 minutes, 10 minutes, etc.).

At stage 506, if battery management processor 205 determines that none of the batteries have a pretest open circuit voltage that is below the predetermined voltage, then method 400 may continue to subroutine 600 at stage 510.

Figure 6:
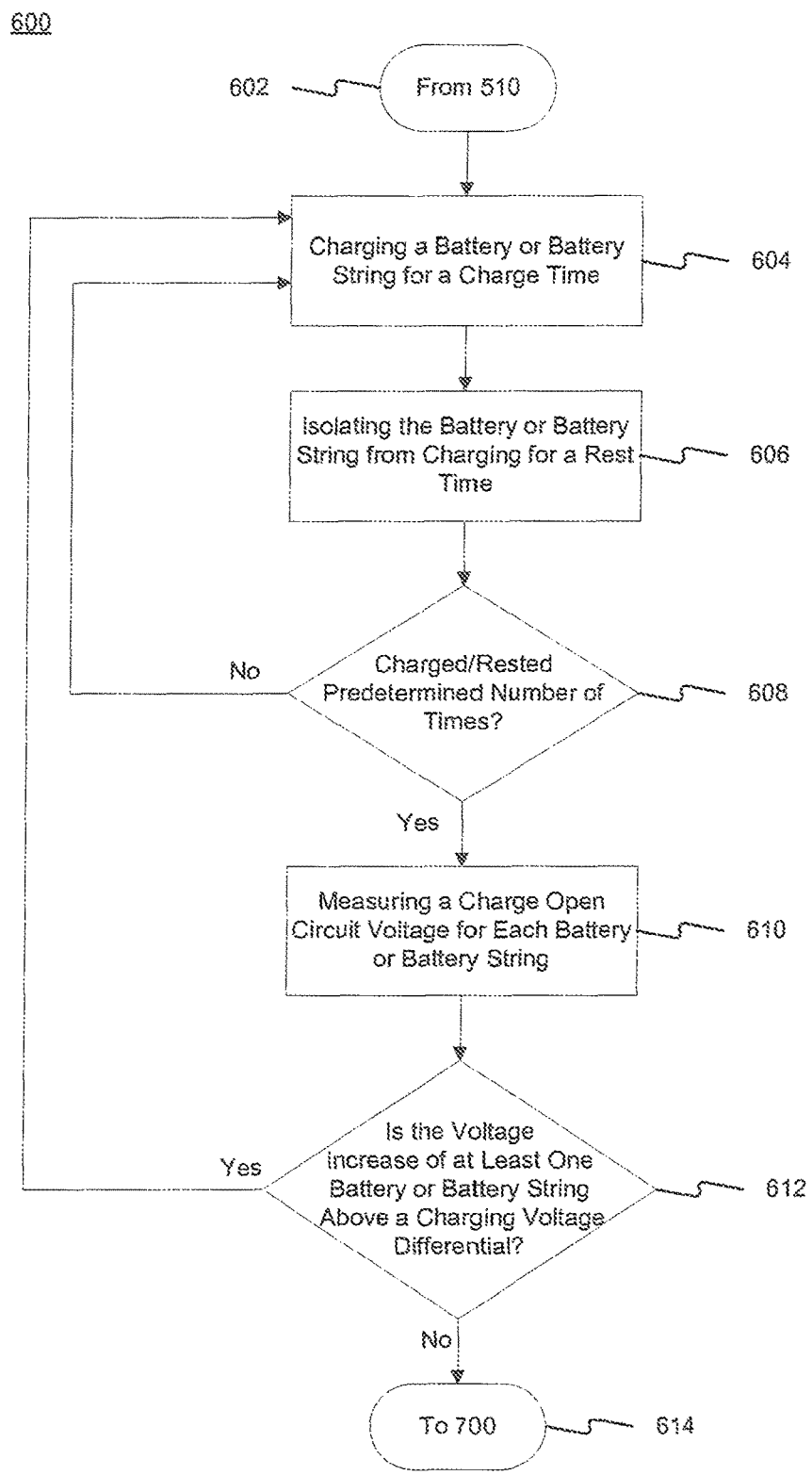
FIG. 6 is a flow chart for a main charge routine.

Turning now to FIG. 6, from termination block 510 method 400 may proceed to main charge routine 600. From starting block 602, main charge routine 600 may proceed to stage 604 where battery management processor 205 may charge a battery in a string of batteries for a charge time. For example, at stage 604 battery management processor 205 may charge a single battery (e.g., battery 1) or first battery string 304 or battery bank 310. The charge time may be a preset value such as 5 minutes, 10 minutes, etc. The preset value may be hardcoded into memory 215 during manufacturing of battery management system 108 or a value a user specifies. In addition, the charge time may be a static value or it may change over time and from battery to battery. For instance, the charge time may be five minutes for battery 5 and 10 minutes for first battery string 304.

From stage 604, main charge routine 600 may proceed to stage 606 where the battery or batteries that were charged in stage 604 may be taken off charge or rested for a rest time. The rest time can be equal to or different than the charge time. Just like the charge time, the rest time may be a preset value such as 5 minutes, 10 minutes, etc. Also like the charge time, the rest time may be hardcoded into memory 215 during manufacturing of battery management system 108 or a value a user specifies. In addition, the rest time may be a static value or it may change over time and from battery to battery, just as the charge time may change. The rest time, just like the charge time, my depend on any number of factors including time between charge/discharge of the batteries, a temperature increase of the battery due to charging/discharging, etc.

After resting the batteries at stage 606, main charge routine 600 proceeds to decision block 608 where battery management processor 205 may determine if stages 604 and 606 have been executed a predetermined number of times. For instance, battery management processor 205 may execute the charging and resting stages 604 and 606 once, five times, ten times, etc. before proceeding to stage 610. The predetermined number of times may vary from battery to battery and battery string to battery string and battery to battery string. In addition, the predetermined number of times may vary depending on any number of factors such as, the length of time between charging the batteries, the length of time between when the batteries were last discharged and are being recharged, a temperature increase of the batteries due to charging/discharging, etc.

After charging and resting the batteries for the predetermined number of times, main charge routine 600 may proceed to stage 610 where battery management processor 205 may measure a post charge open circuit voltage. Just as with measuring the pretest open circuit voltage, the post charge open circuit voltage may include measuring the voltage of each battery individually or an entire battery string.

After measuring the post charge open circuit voltage at stage 610 main charge routine 600 proceeds to decision block 612 where battery management processor 205 may compare the post charge open circuit voltage to a previously measured open circuit voltage reading to determine if stages 604, 606, and 608 need to be repeated. For example, the previously measured open circuit voltage may be the pretest open circuit voltage from pretest routine 500 or a previously recorded post charge open circuit voltage from stage 610.

Consistent with embodiments of the invention, battery management processor 205 may determine that the charge open circuit voltage has increased above a charging voltage differential. When the charge open circuit voltage has increased above the charging voltage differential, battery management processor 205 may repeat stages 604, 606, and 608 again. By way of a non-limiting example, at stage 504 battery management processor 205 may have measured an open circuit voltage of 11 volts and at stage 610 battery management processor 205 may have measured a post charge open circuit voltage of 11.5 volts for battery 1. This increase in voltage indicates that battery 1 is accepting charge. Continuing with this non-limiting example, the charging voltage differential may be 0.1 volts. Thus, the voltage increase is greater than the charging voltage differential and stages 604, 606, and 608 may need to be repeated.

If stages 604, 606, and 608 are repeated, at stage 610 a new post charge open circuit voltage may be record and it may, for example, be 11.55 volts. At decision block 612 battery management processor 205 may determine that the voltage differential between the new post charge open circuit voltage and the post charge open circuit voltage previously measured in stage 610 is less than the charging voltage differential (11.55 V−11.5 V=0.05 V<0.1 V). After determining that the increase in the open circuit voltage readings has increased, less than the charging voltage differential, main charge routine 600 may proceed to termination block 614 and exit to first testing routine 700 of method 400.

Figure 7:
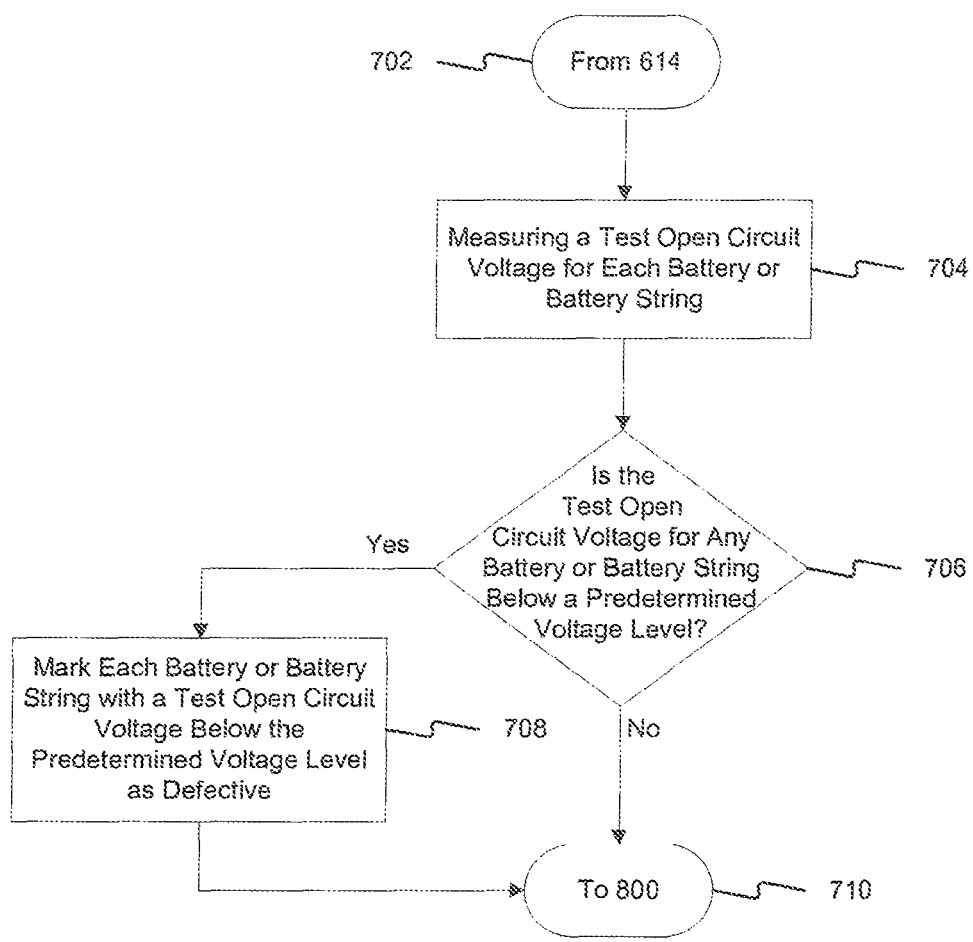
FIG. 7 is a flow chart for a first testing routine.

FIG. 7 is a flow chart for first testing routine 700. First testing routine 700 begins at starting block 702 and may proceed to stage 704 where battery management processor 205 may measure a test open circuit voltage of batteries. For example, at stage 704 battery management processor 205 may measure the test open circuit voltage of each battery individually or each battery string. For instance, at stage 704 battery management processor 205 may measure the test open circuit voltage of batteries 1, 2, 3, and 4 and they may be 12.2 V, 11.9 V, 12.9 V, and 12.5 V, respectively.

After measuring the test open circuit voltage for the batteries, first testing routine 700 may proceed to decision block 706 where battery management processor 205 may determine if any of the batteries have a charge that is less than a predetermined voltage level. For example, the predetermined voltage level may be 12.5 V and the test open circuit voltage of batteries 1, 2, 3, and 4 or first battery 350, second battery 352, third battery 354, and fourth battery 356 may be 12.2 V, 11.9 V, 12.9 V, and 12.5 V, respectively. Thus, at decision block 706 battery management processor 205 may determine that batteries 1 and 2 or first battery 350 and second battery 352 are below the predetermined voltage level.

After determining that at least one battery has a test open circuit voltage that is less than the predetermined voltage level, first testing routine 700 may proceed to stage 708. At stage 708 battery management processor 205 may store in database 205 an indication that batteries 1 and 2 or first battery 350 and second battery 352 may be defective or otherwise need further examination by a service technician. In addition to storing the indication that individual batteries may be defective, battery management processor 205 may store an indication that an entire battery string may be defective or otherwise need further examination by a service technician. After storing the indication in database 205, first testing routine 700 may proceed to termination block 710. At decision block 706, if battery management processor 205 determines that no batteries have a test open circuit voltage below the predetermined voltage level, then first testing routine 700 may proceed from decision block 706 to termination block 710. At termination block 710 first testing routine 700 may exit to load test routine 800.

Figure 8:
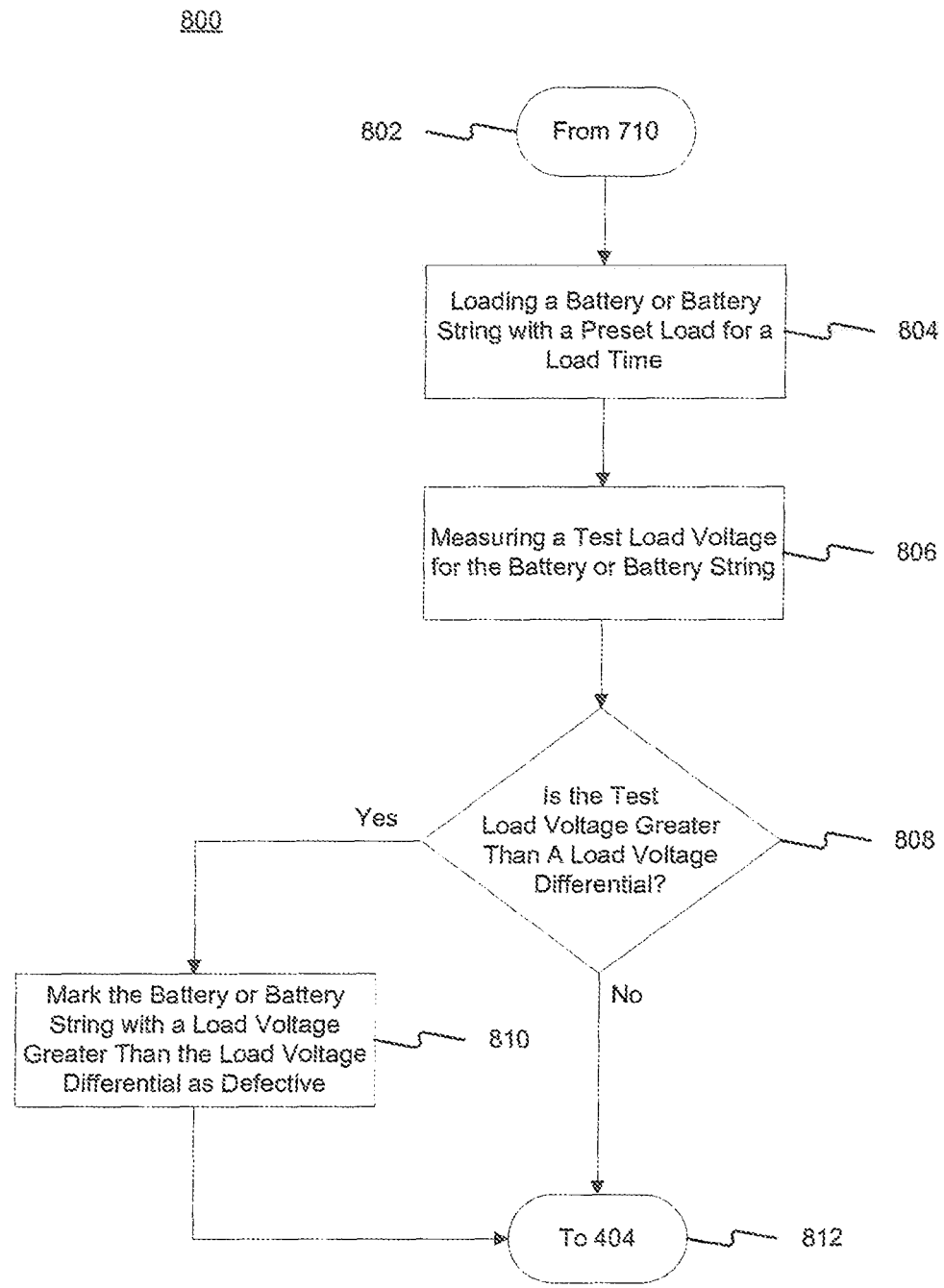
FIG. 8 is a flow chart for a load test routine.

Turning now to FIG. 8, FIG. 8 shows a flow chart for load test routine 800. From starting block 802 load test routine 800 may proceed to stage 804 where the batteries are loaded with a preset load for a load time. Each battery may be loaded with the preset load individually or each battery string may be loaded with the preset load. In addition, the batteries that may have been labeled as defective in first testing routine 700 may or may not be loaded with the preset load. The preset load may be a constant load such as 10 Ohms, or a variable load that increases or decreases with time. The preset load may be hardcoded into memory 215 or a value that can be programmed and changed by a user. Just as with the preset load, the load time may be a constant such as 10 seconds or a variable time that increases or decreases with the load.

After loading the batteries in stage 804 load test routine 800 may proceed from stage 804 to stage 806 where battery management processor 205 may measure a load test voltage for each battery that had the preset load placed on it. For example, after loading batteries 1, 2, 3, and 4 or first battery 350, second battery 352, third battery 354, and fourth battery 356 battery management processor 205 may record voltage measurements of 12.1 V, 12.4 V, 11.9 V, and 12.6 V.

After measuring the battery voltages, load test routine 800 may proceed from state 806 to decision block 808. At decision block 808 battery management processor 205 may compare the load test voltage to a previously stored voltage such as the test open circuit voltage or the pretest open circuit voltage to determine if there is a voltage change that is greeter than a load voltage differential. For example, the load voltage differential may be 1.0 V and the previously stored voltages for batteries 1, 2, 3, and 4 or first battery 350, second battery 352, third battery 354, and fourth battery 356 may be 12.0 V, 11.3 V, 11.5 V, and 11.5 V. Thus, at decision block 808 battery management processor 205 may determine that batteries 2 and 4 or second battery 352 and fourth battery 356 had a voltage drop after loading that is greater than the load voltage differential.

From decision block 808 load test routine may proceed to stage 810 where battery management processor 205 may store an indicator in database 225 that batteries 2 and 4 or second battery 352 and fourth battery 356 may be defective or otherwise require the attention of a service technician. After stage 810 load test routine 800 may proceed to termination block 812 where load test routine 800 may exit to method 400. In addition, at decision block 808 if battery management processor 205 determines that no batteries had a voltage drop that was less than the load voltage differential then load test routine 800 may proceed to termination block 812 where load test routine 800 may exit to method 400.

Figure 9:
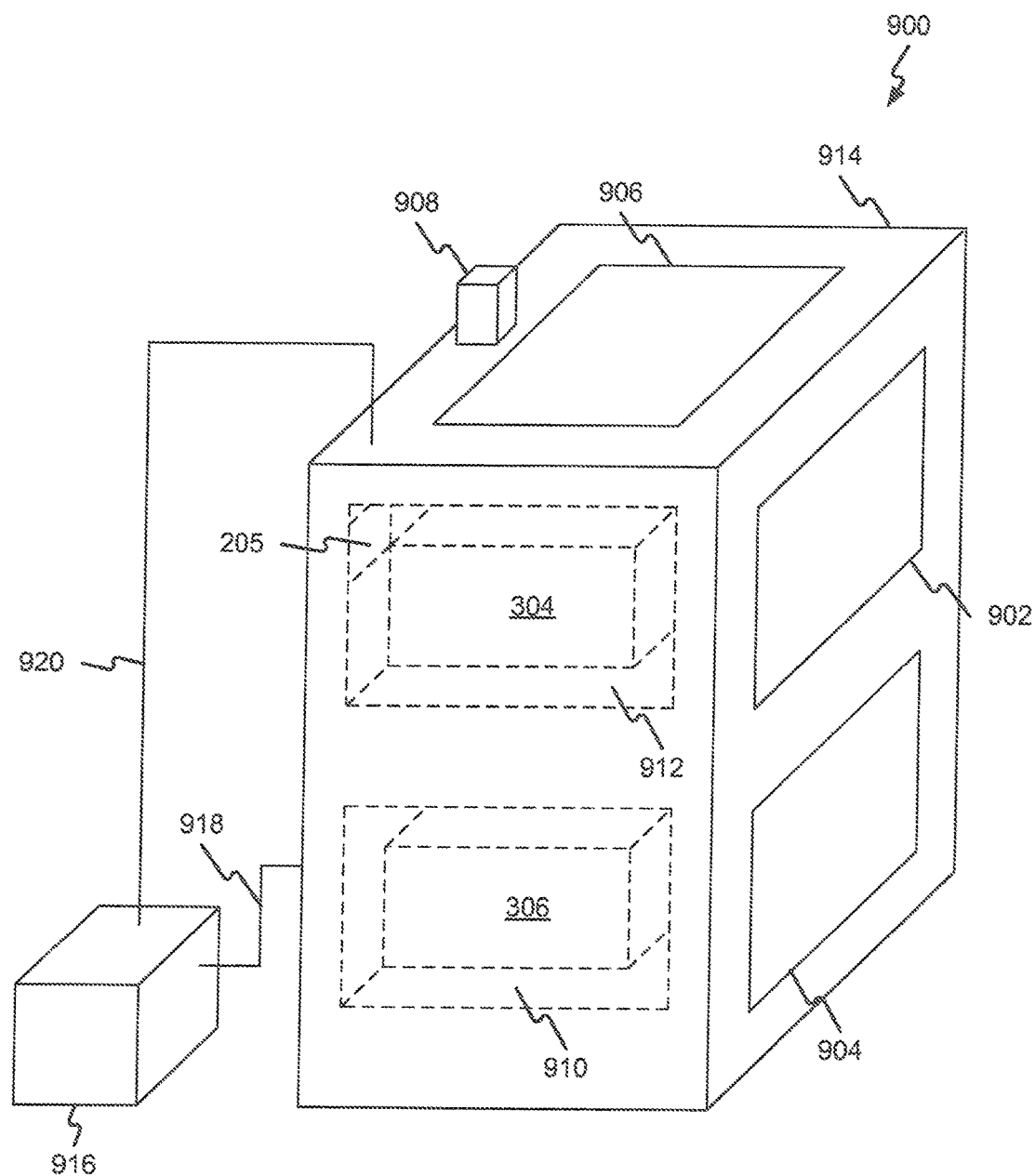
FIG. 9 shows a thermal box.

FIG. 9 shows a thermal box 900. Thermal box 900 may include a first vent 902, a second vent 904, a third vent 906, a fan 908, a floor 910, a shelf 912, a top 914 and battery management processor 205. The walls of thermal box 900 may be insulated to help retain cool air inside thermal box 900 and minimize heat gain from ambient conditions. In the embodiment shown in FIG. 9, thermal box 900 may have first battery string 304 and second battery string 306 located on shelf 912 and floor 910, respectively. In addition, thermal box 900 may also be connected to a micro air-conditioner 916 by a first duct 918 and a second duct 920.

During operation, as the ambient temperature starts to rise at sunrise, battery management processor 205 may close first vent 902, second vent 904, and third vent 906 to retain cool ambient air inside thermal box 900. The time at which first vent 902, second vent 904, and third vent 906 close may be a fixed time of day (e.g., 7:00 a.m.) or dependent on temperature. For instance, during the night the ambient temperature may be as low as 60° F. As the day progresses, the ambient temperature may rise to a maximum ambient temperature (e.g., 70° F.). Once the ambient temperature reaches the maximum ambient temperature, battery management processor 205 may close first vent 902, second vent 904, and third vent 906 to trap air at 70° F. Inside thermal box 900.

As the ambient temperature continues to rise as the day progresses, the interior of thermal box 900 may remain at a lower temperature than ambient due to the thermal inertia of the contents of thermal box 900 (i.e., first battery string 304 and second battery string 306). However, due to conduction, convection, and radiant heat transfer the interior temperature of thermal box 900, and its contents, may rise.

As the sun sets, the ambient temperature may decrease. Due to thermal box 900 being insulated, its interior temperature may not decrease at the same rate as the ambient temperature. In embodiments of the invention, battery management processor 205 may utilize thermal couples or thermistors to monitor the ambient temperature and the interior temperature of thermal box 900. When the ambient temperature is below the interior temperature, battery management processor 205 may open first vent 902, second vent 904, and third vent 906 to allow ambient air to flow into thermal box 900. Fan 908 may be used to induce convection and draw ambient air into thermal box 900.

During the day, it is possible that the interior temperature may rise above a maximum interior temperature. When the interior temperature of thermal box 900 rises above the maximum interior temperature, battery management processor 205 may activate micro air-conditioner 916 to supply cool air, via first duct 918 and second duct 920, to the interior of thermal box 900.

In addition, during a maintenance routine (e.g., method 400) when batteries are being charged they may create a heat generation source inside thermal box 900. To help maintain a lower or constant battery temperature, battery management processor 205 may open first vent 902, second vent 904, and third vent 906 to allow air flow, via natural convection, through thermal box 900. In addition, fan 908 may be utilized to induce forced convection to help cool the contents of thermal box 900. Furthermore, micro air-conditioner 916 may be used to cool the contents of thermal box 900. For example, micro air-condition 916 may run at night. Embodiments of the invention may also include using fan 908 when the outside temperature is below a predetermined temperature (e.g., 18C) and run micro air-conditioner 916 when the outside temperature is above the predetermined temperature. In addition, micro air-condition 916 may operate when the batteries are cycled (e.g., discharged or during execution of method 400).

Embodiments of the invention may or may not use the batteries' temperature to control operation of thermal box 900. In addition, embodiments of the invention may or may not use outside temperature only in conjunction with an algorithm to control the cooling. For example, the batteries' temperature may be monitored for reporting purposes and battery management processor 205 may predict the batteries' temperature based on a last cooling step and adjusted for outside temperature increases or decreases. In addition, the energy inputted into the system due (e.g., during execution of method 400) and the insulation configuration of thermal box 900 may be utilized in calculating temperature increases and decreases. Calculating the energy input into thermal box 900 may be more accurate than simply measuring battery temperatures.

While FIG. 9 shows a single thermal box 900 housing first battery string 304 and second battery string 306, embodiments of the invention may have any number of thermal boxes and any number of battery strings. In addition, multiple micro air-conditioners may be used and micro air-conditioners may be sized to accommodate larger potential heat gains. In addition, embodiments of the invention may utilize a web interface to allow a user to monitor and control thermal box 900. For instance, the user may monitor the internal temperature and the ambient temperature remotely. Also, the user may change the maximum ambient temperature, the maximum interior temperature, and open and close first vent 902, second vent 904, and third vent 906 as needed.

Embodiments of the Invention, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present invention may be embodied in hardware and/or in software (including firmware, resident software, micro-code, etc.). In other words, embodiments of the present invention may take the form of a computer program product on a computer-usable or computer-readable storage medium having computer-usable or computer-readable program code embodied in the medium for use by, or in connection with, an instruction execution system. A computer-usable or computer-readable medium may be any medium that can contain, store, communicate, propagate, or transport the program for use by, or in connection with, the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present invention, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the invention have been described, other embodiments may exist. Furthermore, although embodiments of the present invention have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the invention.

All rights including copyrights in the code included herein are vested in and the property of the Applicant. The Applicant retains and reserves all rights in the code included herein, and grants permission to reproduce the material only in connection with reproduction of the granted patent and for no other purpose.

While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as examples for embodiments of the invention.

What is claimed is:

1. A method for battery management, the method comprising:
   performing a pretest routine on a first battery string in a battery bank;
   performing a main charge routine on the first battery string;
   performing a non-load testing routine on the first battery string; and
   performing a load testing routine on the first battery string;
   wherein performing the pretest routine comprises:
      measuring a pretest open circuit voltage of each of a plurality of batteries in the first battery string, and
      until the pretest open circuit voltage of each battery in the first battery string is not below a predetermined voltage, performing a preliminary charge routine comprising:
         charging the first battery string, and
         measuring the pretest open circuit voltage of each of the plurality of batteries in the first battery string;
   wherein performing the main charge routine comprises:
      (i) charging the first battery string for a charge time,
      (ii) isolating the first battery string from charging for a rest time,
      (iii) repeating stages (i) and (ii) a predetermined number of times, and
      (iv) measuring a charge open circuit voltage for each of the plurality of batteries in the first battery string,
      until the charge open circuit voltage of each battery in the first battery string has increased less than a charging voltage differential;
   wherein performing the non-load testing routine comprises:
      measuring a test open circuit voltage for each battery in the first battery string, and
      recording, in a database, a first defective indicator that a first battery in the first battery string is defective when the test open circuit voltage for the first battery is below a predetermined voltage level; and
   wherein performing the load testing routine comprises:
      loading each of the plurality of batteries in the first battery string not having the first defective indicator stored in the database with a preset load for a load time,
      measuring, after the load time, a test load voltage for each of the plurality of batteries loaded with the preset load, and
      recording, in the database, a second defective indicator that a second battery in the first battery string is defective when a difference between the test open circuit voltage of the second battery and the test load voltage of the second battery is greater than a load voltage differential.

2. The method of claim 1, wherein performing the pretest routine on the first battery string in the battery bank comprises performing the pretest routine on a plurality of battery strings including the first battery string.

3. The method of claim 2, further comprising charging a second battery string in the plurality of battery strings.

4. The method of claim 1, further comprising performing the pretest routine in response to determining that power has been restored after a power outage time of greater than a predetermined time.

5. The method of claim 1, further comprising performing the pretest routine at a next scheduled time in response to determining that power has been restored after a power outage time of less than a predetermined time.

6. A method for battery management, the method comprising:
   (i) charging a first battery string in a battery bank for a charge time;
   (ii) isolating the first battery string from charging for a rest time;
   (iii) measuring a test open circuit voltage for each battery in the first battery string;
   (iv) recording, in a database, a first defective indicator that a first battery in the first battery string is defective when the test open circuit voltage for the first battery is below a predetermined voltage level;
   (v) loading each of the batteries in the first battery string not having the first defective indicator stored in the database with a preset load for a load time;
   (vi) measuring, after the load time, a test load voltage for each of the batteries in the first battery string loaded with the preset load; and
   (vii) recording, in the database, a second defective indicator that a second battery in the first battery string is defective when the test load voltage for the second battery is greater than a load voltage differential.

7. The method of claim 6, further comprising performing a pretest routine on the first battery string in the battery bank, wherein performing the pretest routine comprises:
   measuring a pretest open circuit voltage of each battery in the first battery string; and
   performing a preliminary charge routine on the battery string when the pretest open circuit voltage of any battery in the first battery string is below a predetermined voltage, wherein performing the preliminary charge routine comprises:
      charging the first battery string, and
      measuring the pretest open circuit voltage for each battery in the first battery string.

8. The method of claim 7, further comprising repeating the preliminary charge routine until the pretest open circuit voltage of each battery in the first battery string is not below the predetermined voltage.

9. The method of claim 6, further comprising repeating the method of claim 1 at regularly scheduled time intervals.

10. The method of claim 6, further comprising repeating stages (i) and (ii) until the charge open circuit voltage of each battery in the first battery string has increased less than a charging voltage differential.

11. The method of claim 6, wherein charging the first battery string in the battery bank comprises charging a plurality of battery strings including the first battery string.

12. The method of claim 11, further comprising charging a second battery string in the plurality of battery strings.

13. The method of claim 6, further comprising charging the first battery string in the battery bank in response to determining that power has been restored after a power outage time of greater than a predetermined time.

14. The method of claim 6, further comprising charging the first battery string in the battery bank at a next scheduled time in response to determining that power has been restored after a power outage time of less than a predetermined time.

15. A system for managing batteries, the system comprising:
a memory storage; and
a processing unit coupled to the memory storage, wherein the processing unit is operative to:
charge a first battery string in a battery bank for a charge time,
isolate the first battery string from charging for a rest time,
measure a test open circuit voltage for each battery in the first battery string,
record, in a database stored in the memory, a first defective indicator that a first battery in the first battery string is defective when the test open circuit voltage for the first battery is below a predetermined voltage level,
load each of the batteries in the first battery string not having the first defective indicator stored in the database with a preset load for a load time, measure, after the load time, a test load voltage for each of the batteries loaded with the preset load, and
record, in the database, a second defective indicator that a second battery is defective when the test load voltage for the second battery is greater than a load voltage differential.

16. The system of claim 15, further comprising the processing unit being operative to perform a pretest routine on a first battery string in a battery bank, wherein performing the pretest routine comprises the processing unit operative to:
measure a pretest open circuit voltage of each of a plurality of batteries in the first battery string, and
perform a preliminary charge routine on the first battery string when the pretest open circuit voltage of any battery in the first battery string is below a predetermined voltage, wherein performing the preliminary charge routine comprises the processing unit operative to:
charge the first battery string, and
measure the pretest open circuit voltage for each battery in the first battery string; and
repeat the preliminary charge routine until the pretest open circuit voltage of each battery in the first battery string is not below the predetermined voltage.

17. The system of claim 15, wherein the battery bank comprises a plurality of battery strings including the first battery string.

18. The system of claim 17, further comprising the processing unit being operative to charge a second battery string in the plurality of battery strings.

19. The system of claim 15, further comprising the processing unit being operative to charge the first battery string in the battery bank in response to determining that power has been restored after a power outage time of greater than a predetermined time.

20. The system of claim 15, further comprising the processing unit being operative to charge the first battery string in the battery bank at a next scheduled time in response to determining that power has been restored after a power outage time of less than a predetermined time.

* * * * *